United States Patent
Cheng et al.

(10) Patent No.: US 9,224,718 B2
(45) Date of Patent: Dec. 29, 2015

(54) WHITE LIGHT EMITTING DIODES PACKAGE CONTAINING PLURAL BLUE LIGHT-EMITTING DIODES

(71) Applicant: Harvatek Corporation, Hsinchu (TW)

(72) Inventors: Tsung-Kan Cheng, Taipei (TW); Chia-Chin Chen, Miaoli County (TW); Chia-Pin Chang, Hsinchu (TW)

(73) Assignee: Harvatek Corporation, Hsinchu (TW)

( * ) Notice: Subject to any disclaimer, the term of this patent is extended or adjusted under 35 U.S.C. 154(b) by 6 days.

(21) Appl. No.: 14/077,197

(22) Filed: Nov. 11, 2013

(65) Prior Publication Data

US 2014/0209934 A1      Jul. 31, 2014

(30) Foreign Application Priority Data

Jan. 28, 2013   (TW) .............................. 102103155 A (51) Int. Cl.
| | |
|---|---|
| *H01L 25/07* | (2006.01) |
| *H01L 33/62* | (2010.01) |
| *H01L 27/15* | (2006.01) |
| *H01L 25/075* | (2006.01) |
| *H01L 33/50* | (2010.01) |
| *H01L 33/54* | (2010.01) |
| *F21Y 103/00* | (2006.01) |

(52) U.S. Cl.
CPC ....... *H01L 25/0753* (2013.01); *F21Y 2103/003* (2013.01); *H01L 33/505* (2013.01); *H01L 33/54* (2013.01); *H01L 2224/45144* (2013.01); *H01L 2224/48091* (2013.01); *H01L 2224/48137* (2013.01)

(58) Field of Classification Search
CPC ... H01L 25/0753; H01L 33/62; H01L 27/153; H01L 33/20; F21K 9/00
USPC ........................ 257/88; 438/22, 24, 28, 46, 47
See application file for complete search history.

(56) References Cited

U.S. PATENT DOCUMENTS

2004/0129945 A1* 7/2004 Uemura ................ H01L 33/507
                                                              257/98

(Continued)

FOREIGN PATENT DOCUMENTS

| | | |
|---|---|---|
| EP | 2535640 A1 | 12/2012 |
| JP | 2003249692 A | 9/2003 |
| JP | 2006278924 A | 10/2006 |
| JP | 2009004698 A | 1/2009 |
| JP | 2012138240 A | 7/2012 |

(Continued)

*Primary Examiner* — Allen Parker
*Assistant Examiner* — Didarul Mazumder
(74) *Attorney, Agent, or Firm* — CKC & Partners Co., Ltd.

(57) ABSTRACT

A white light-emitting diode (LED) package containing plural blue LED chips is disclosed. The white LED package includes a transparent plate, plural blue LED chips bonded on a front surface of the transparent plate, a front fluorescent glue layer covering the plural blue LED chips, and a rear transparent glue layer covering a rear surface of the transparent plate and located at a position aligned with the front fluorescent glue layer. The edge of the rear transparent glue layer has an inclined lateral surface or a curved inclined lateral surface. Therefore, the light can be extracted from both front and rear surfaces, and the light extraction efficiency of the rear surface of the transparent plate is increased. The rear transparent glue layer can be replaced by a rear fluorescent glue layer to reduce the color temperature difference between the lights extracted from the front surface and the rear surface.

4 Claims, 8 Drawing Sheets

(56) References Cited

U.S. PATENT DOCUMENTS

| | | | |
|---|---|---|---|
| 2010/0155761 A1* | 6/2010 | Ota et al. | 257/98 |
| 2010/0163892 A1* | 7/2010 | Liu | F21K 9/30 257/89 |
| 2013/0161655 A1* | 6/2013 | Xu | H01L 25/0753 257/88 |

FOREIGN PATENT DOCUMENTS

| | | |
|---|---|---|
| JP | 2012146738 A | 8/2012 |
| JP | 2012-169264 A | 9/2012 |
| WO | 2011042999 A1 | 4/2011 |
| WO | 2012090356 A1 | 7/2012 |

\* cited by examiner

WHITE LIGHT EMITTING DIODES PACKAGE CONTAINING PLURAL BLUE LIGHT-EMITTING DIODES

RELATED APPLICATIONS

This application claims priority to Taiwanese Application Ser. No. 102103155, filed on Jan. 28, 2013, which is herein incorporated by reference.

BACKGROUND

1. Field of Invention

The invention relates to a light-emitting diode (LED) package. More particularly, the invention relates to a white LED package containing plural blue LED chips emitting light from both front and rear surfaces thereof.

2. Description of Related Art

A light-emitting diodes (LED) package is completed by die bonding, wire bonding, molding, and pinning to weld LED chips to a printed circuit board. The white LED package is usually a LED package includes a blue LED chip covered by yellow fluorescent glue to form white extracting light The white LED package can be applied to various products, such as lamps, a backlight module of a liquid crystal display, and the like.

A white LED package can be divided into a package containing a single blue LED chip or a package containing plural blue LED chips connected serially or in parallel. For products like lamps and lanterns, the difference between using a white LED package containing plural blue LED chips and using plural white LED packages respectively containing a single LED chip is that the former one has a simpler structure and does not require repeating welding process to respectively each single LED package.

For the above-described white LED packages, in order to improve the light extraction efficiency thereof, a light reflecting surface is disposed under a bonded blue LED chip to reflect the lateral light and the rear light of the blue LED chip to increase the brightness of the extracted light.

Figure 1:
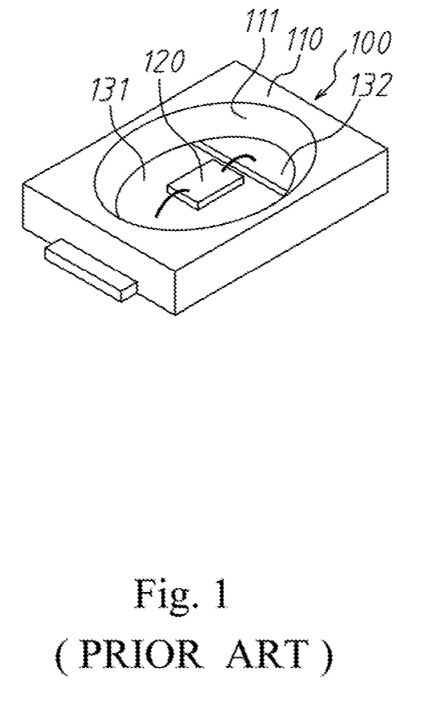
FIG. 1 is an appearance schematic view of a conventional white LED package containing a single light-emitting diode chip.

FIG. 1 illustrates a conventional white LED package 100 containing a single LED chip. The white LED package 100 has a light reflection cup 110, and the inner surface 111 of the light reflection cup 110 is white. Blue LED chip 120 is bonded on a negative electrode plate 131, and electrically connected to the negative electrode plate 131 and a positive electrode plate 132. Silver coatings (not shown) are disposed on the surfaces of the negative electrode plate 131 and the positive electrode plate 132. The design of these silver coatings and the white inner surface 111 of the light reflection cup 110 is used for reflecting the light emitted from the lateral and rear directions of the blue LED chip 120 as much as possible and thus increase the brightness of the extracting white lights.

Figure 2:
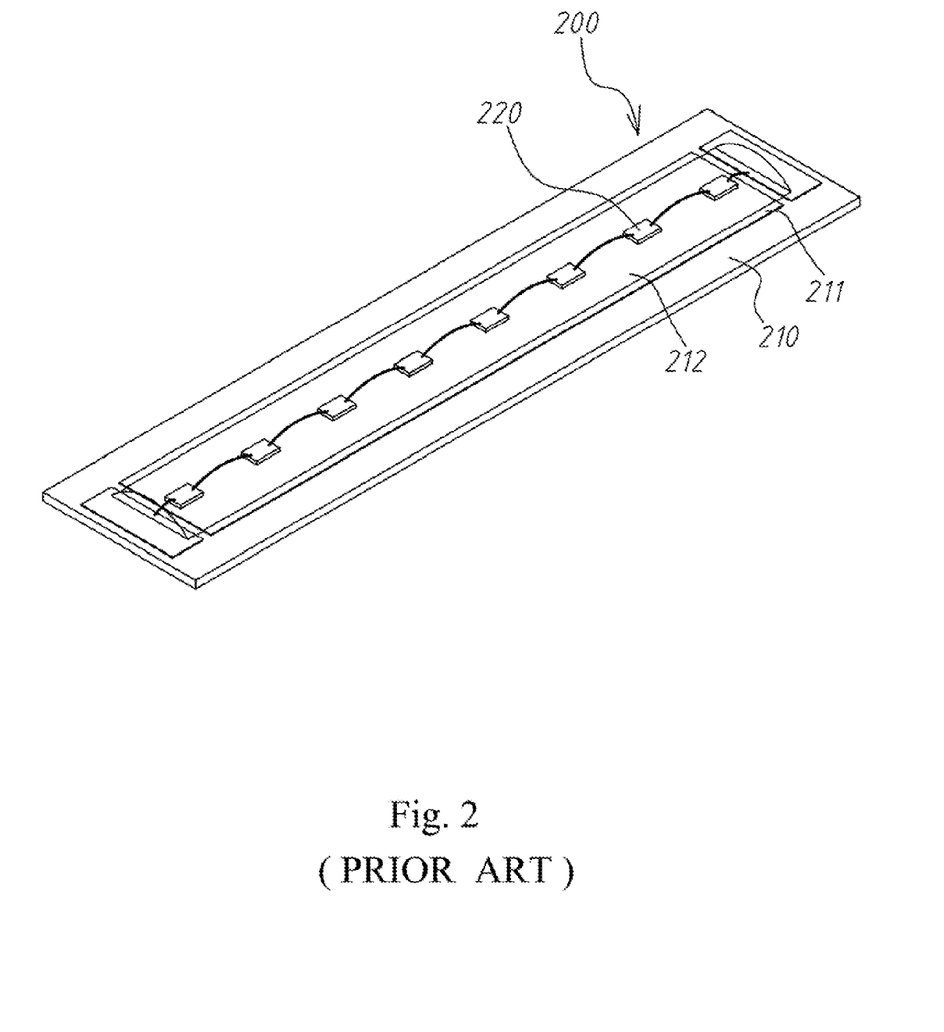
FIG. 2 is an appearance schematic view of a conventional white LED package containing plural light-emitting diode chips.

FIG. 2 illustrates a conventional white LED package 200 containing plural LED chips. The white LED package 200 has a circuit board 210 having a ground serving as a light reflection area 211. Plural blue LED chips 220 are bonded on the light reflection area 211, and a yellow fluorescent glue layer 212 covers the plural blue LED chips 220. This design is used to reflect light emitted from the lateral and the rear directions of the plural blue LED chips 220 as much as possible and thus increase the brightness of the extracting lights.

The above-described conventional LED packages both provide only one light reflection surface, and the emitted light can only be extracted from the single front surface. Therefore, the emitted light cannot be extracted from both of the front surface and the rear surface.

SUMMARY

The invention provides a white LED package containing plural blue light-emitting diode chips (LEDs). The white LED package can extract lights from both front and rear surfaces.

According to an aspect of the invention, a white LED package containing plural blue LED chips is provided. The white LED package includes a transparent plate, plural blue LED chips bonded on a front surface of the transparent plate, a front fluorescent glue layer covering the plural blue LED chips, and a rear transparent glue layer covering a rear surface of the transparent plate and located at a position aligned with the front fluorescent glue layer, wherein the edge of the rear transparent glue layer has an inclined lateral surface or a curved inclined lateral surface. Therefore, the light can be extracted from both front and rear surfaces, and the light extraction efficiency of the rear surface of the transparent plate is increased by the rear transparent glue layer.

According to another aspect of the invention, a white LED package containing plural blue LED chips is provided. The white LED package includes a transparent plate, plural blue LED chips bonded on a front surface of the transparent plate, a front fluorescent glue layer covering the plural blue LED chips, and a rear fluorescent glue layer covering a rear surface of the transparent plate and located at a position aligned with the front fluorescent glue layer, wherein the edge of the rear fluorescent glue layer has an inclined lateral surface or a curved inclined lateral surface. Therefore, the light can be extracted from both front and rear surfaces. In addition, the light extraction efficiency of the rear surface of the transparent plate can be increased, and the color temperature differences between the front extracting light and the rear extracting light can be reduced by the rear fluorescent glue layer.

DETAILED DESCRIPTION

The foregoing and other technical contents, features and functions of the invention will be clearly presented through the following detailed description of embodiments with reference to the accompanying drawings.

As shown in FIGS. 3 to 6, a white LED package 300 containing plural blue light-emitting diode chips (LEDs) according to a first embodiment of the invention includes a transparent plate 310, plural blue LED chips 320, a front fluorescent glue layer 330, and a rear transparent glue layer 340.

The transparent plate 310 is a sheet material presenting clear or slightly misty view when light passes through the transparent plate 310. The material of the transparent plate 310 is glass, plastic, resin, or aluminum oxide, for example. The transparent plate 310 has a front surface 311 and an opposite rear surface 312.

The plural blue LED chips 320 are bonded on the front surface 311 of the transparent plate 310. The plural blue LED chips 320 can be electrically connected by connecting a positive electrode and a negative electrode of the different blue LED chips 320 through a jumper wire 321 (such as a gold wire or an aluminum wire) to form various kinds of circuits, such as a serial circuit, a parallel circuit, a parallel-connected serial circuit, or a serial-connected parallel circuit. Then, the positive electrode of the most front blue LED chip 320 and the negative electrode of the most rear blue LED chip 320 are respectively connected to two terminal plates 313, which are then connected to a power source (not shown in figures) to provide electricity to light the plural blue LED chips.

The front fluorescent glue layer 330 covers the plural blue LED chips 320. The material of the front fluorescent glue layer 330 is silicon doped with powder of yellow fluorescent 331 or the like.

The rear transparent glue layer 340 covers the rear surface 312 of the transparent plate 310 and located at a position aligned with the front fluorescent glue layer 330. The edge of the rear transparent glue layer 340 has an inclined lateral surface 341 (as shown in the schematic cross-sectional view of FIG. 6), and particularly is a curved inclined lateral surface. The material of the rear transparent glue layer 340 can be silicone or the like. The rear transparent glue layer 340 and the inclined lateral surface 341 or the curved inclined lateral surface 341 thereof can be formed by dropping a liquid silicone onto the rear surface 312 of the transparent plate 310. Then, an inclined lateral surface 341 or a curved inclined lateral surface 341 at the edge of the silicone is naturally formed by the adhesive force and surface tension of the liquid silicone. It is similar to the edge having a curved inclined lateral surface formed by dropping a water drop onto a glass surface. Then, the silicone is cured by heating.

The front fluorescent glue layer 330 and the rear transparent glue layer 340 are formed by respectively dropping the liquid glue onto the front surface 311 of the transparent plate 310 to cover the plural blue LED chips 320, and the rear surface 312 of the transparent plate 310, and then curing the liquid glue. The method of dropping the liquid glue is not limited.

Figure 3:
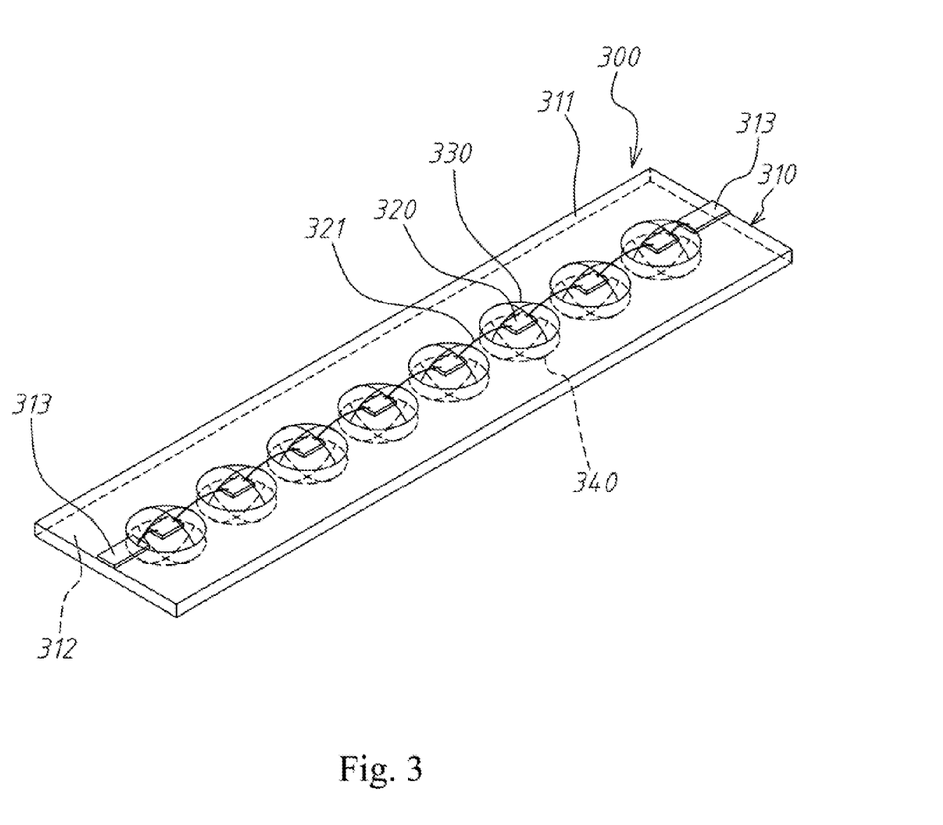
FIG. 3 is an appearance schematic view of a white LED package containing plural blue LED chips according to a first example of a first embodiment of the invention.

As shown in the first example of FIG. 3, the liquid glue may be dropwisely dropped onto the front surface 311 of the transparent plate 310 to cover the plural blue LED chips 320, and the rear surface 312 of the transparent plate 310, respectively. Then, the liquid glues are cured to form spot-shaped front fluorescent glue layers 330 and spot-shaped rear transparent glue layers 340, respectively.

Figure 4:
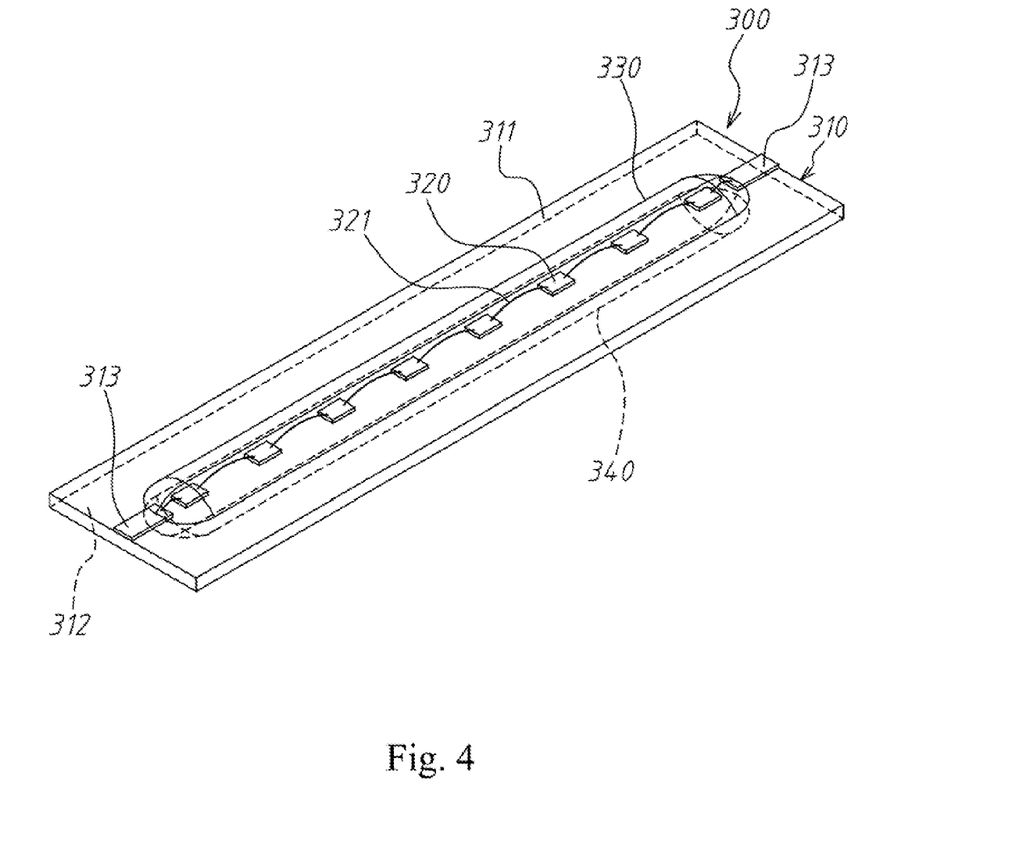
FIG. 4 is an appearance schematic view of a white LED package containing plural blue LED chips according to a second example of the first embodiment of the invention.

Alternatively, as shown in the second example of FIG. 4, the liquid glue may be dropped as long strips onto the front surface 311 of the transparent plate 310 to cover the plural blue LED chips 320, and the rear surface 312 of the transparent plate 310, and then cured to form strip-shaped front fluorescent glue layers 330 and strip-shaped rear transparent glue layers 340, respectively.

Figure 5:
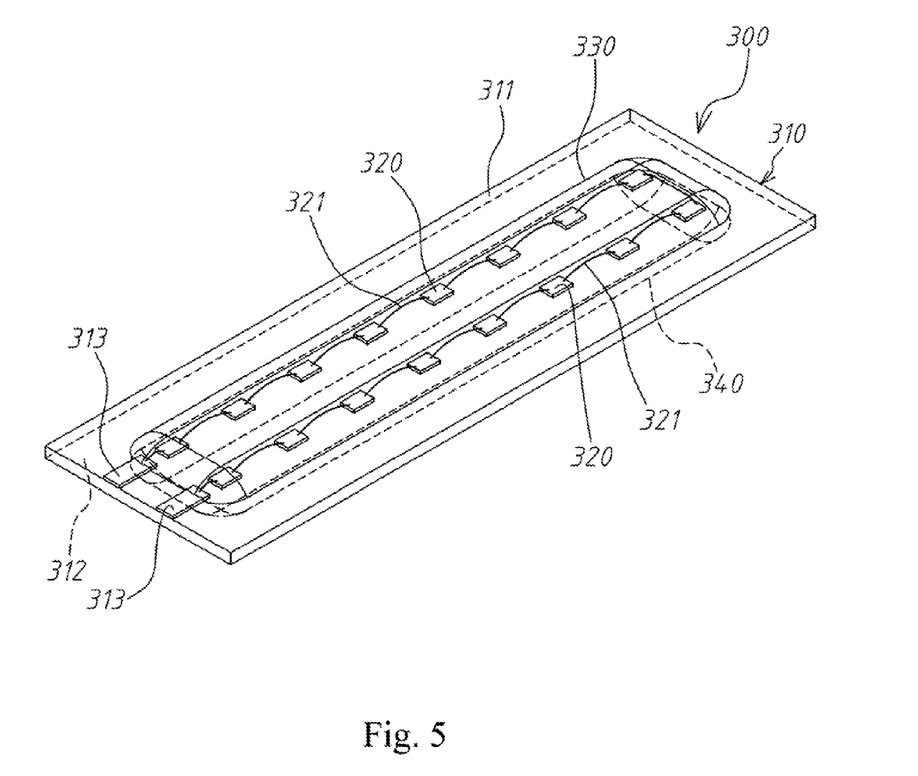
FIG. 5 is an appearance schematic view of a white LED package containing plural blue LED chips according to a third example of the first embodiment of the invention.

Alternatively, as shown in the third example of FIG. 5, the liquid glue may be dropped as a plane onto the front surface 311 of the transparent plate 310 to cover the plural blue LED chips 320 and the rear surface 312 of the transparent plate 310, and then cured to form a planar-shaped front fluorescent glue layer 330 and a planar-shaped rear transparent glue layer 340, respectively. No matter which of the above dropping method is applied, the inclined lateral surface 341 or curved inclined lateral surface 341 is naturally formed at the edge of the rear transparent glue layer 340.

Figure 6:
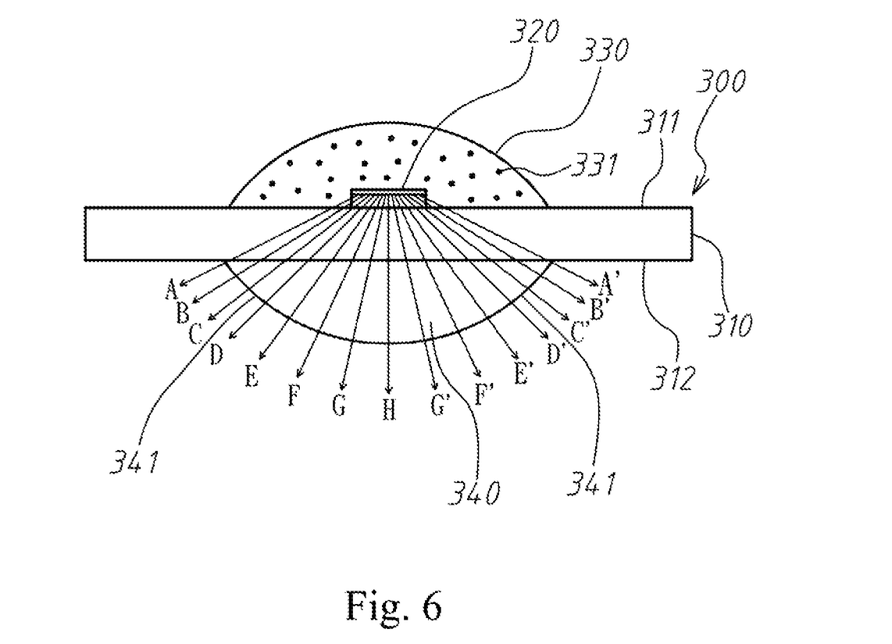
FIG. 6 is a schematic cross-sectional view of the white LED package containing plural blue LED chips shown in FIGS. 3, 4 and 5.

For the white LED package containing plural blue LED chips according to the first embodiment of the invention, white light can be extracted from the front surface of the blue LED chips 320 through the front fluorescent glue layer 330. The light can also be extracted from the rear surface of the blue LED chips 320 through the transparent plate 310, the rear transparent glue layer 340 and the inclined lateral surface 341 of the rear transparent glue layer 340. The light extraction efficiency of the rear surface of the white LED package 300 can be thus increased.

Therefore, for the white LED package containing plural blue LED chips according to the first embodiment of the invention, the primary technical feature is that "a rear transparent glue layer disposed on the rear surface of the transparent plate and located on a position aligned with the front fluorescent glue layer, and the edge of the rear transparent glue layer having an inclined lateral surface or a curved inclined lateral surface".

The reason for doing so is that if only one transparent plate 310 is used for extracting light from both surfaces (as shown in the schematic cross-sectional view of FIG. 7), the light emitted from the lateral and the bottom directions of the blue LED chips 320, which is bonded on the front surface 311 of the transparent plate 310, and having a refraction angle more than about 41.5° cannot be extracted from the rear surface 312 of the transparent plate 310, since the light can only be reflected between the front surface 311 and the rear surface 312 of the transparent plate 310. The refraction angle 41.5° above is calculated by a common glass having a refractive index of 1.51 and the air having a refractive index of 1.0.

Figure 7:
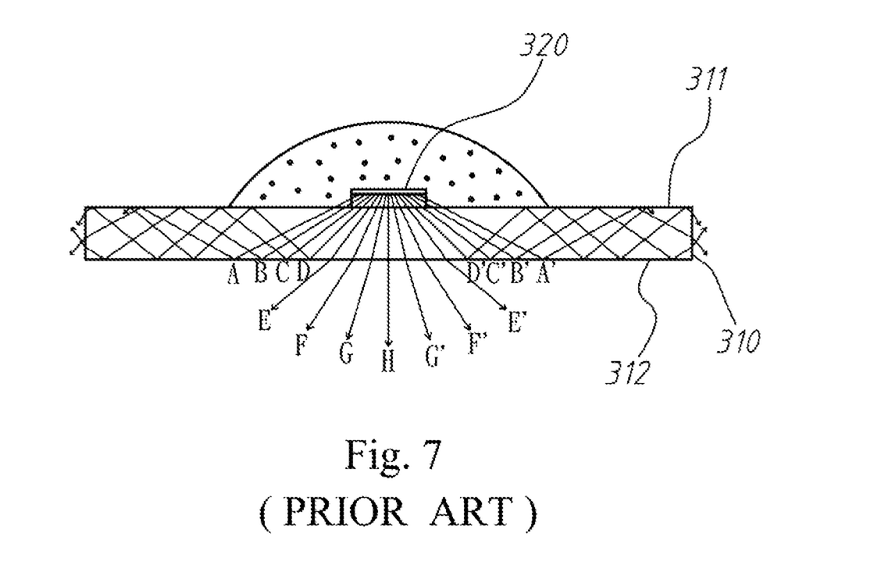
FIG. 7 is a schematic cross-sectional view of the white LED package for plural LED chips shown in FIG. 6 when the rear transparent glue layer is not disposed to the white LED package.

More particularly, as shown in FIG. 7, the lateral light A, B, A' and B' emitted by the blue LED chips 320 has a refraction angle more than 41.5°, and thus can only be reflected between the front surface 311 and the rear surface 312 of the transparent plate 310, but cannot be extracted from the rear surface 312 of the transparent plate 310. Rear light C, 0, C' and D' emitted by the blue LED chips 320 also has a refraction angle more than 41.5°, and thus can only be reflected between the front surface 311 and the rear surface 312 of the transparent plate 310, but cannot be extracted from the rear surface 312 of the transparent plate 310.

Accordingly, if only the transparent plate 310 is used to bond the blue LED chips 320, although the light can be extracted from the front surface 311 and the rear surface 312, the light extraction efficiency of the rear surface 312 of the transparent plate 310 can be very low. As shown in FIG. 7, only the rear light E, F, G, E', F', G' and H having a refraction angle smaller than 41.5° can be extracted from the rear surface 312 of the transparent plate 310, and the light A, B, A', B', C, D, C' and D' cannot be extracted from the rear surface 312 of the transparent plate 310.

In FIG. 6, with respect to the white LED package containing plural blue LED chips according to the first embodiment of the invention, the technical feature of a rear transparent glue layer disposed on the rear surface of the transparent plate and located on a position aligned with the front fluorescent glue layer, and the edge of the rear transparent glue layer having an inclined lateral surface or a curved inclined lateral surface can extract the lateral light A, B, A' and B' and the rear light C, D, C' and 0' of the blue LED chips 320 from the rear surface 312 of the transparent plate 310. That is, the problem of not being capable of extracting the light emitted by the blue LED chips 320 having a refraction angle more than 41.5° from the rear surface 312 of the transparent plate 310 is avoided. Therefore, except that the white LED package 300 containing plural blue LEDs according to the first embodiment of the invention has the function of extracting light from both the front and rear surfaces, the white LED package 300 also can increase the light extraction efficiency of the rear surface 312 of the transparent plate 310.

The light extracted from the rear transparent glue layer 340 is not limited to the lateral light and the rear light emitted by the blue LED chips 320. Yellow fluorescent light excited by the front light emitted by the blue LED chips 320 and emitted from the front fluorescent glue layer 330 on the front surface 311 of the transparent plate 310 also can be extracted from the rear surface 312 of the transparent plate 310 to mix with the blue lateral light and the blue rear light to obtain white light.

Figure 8:
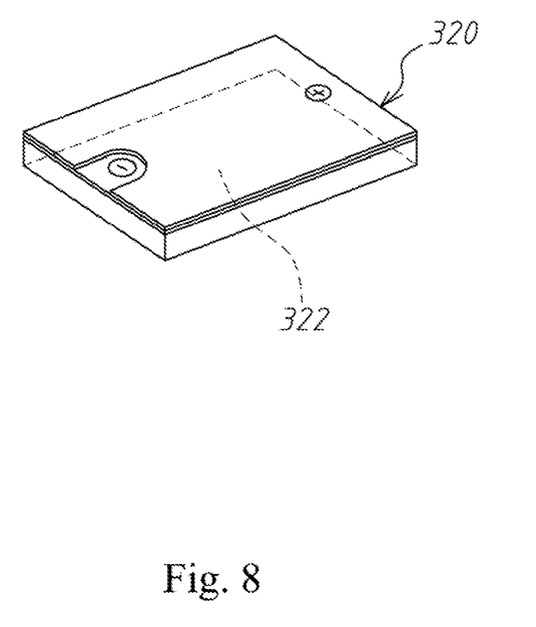
FIG. 8 is an appearance schematic view of the blue LED chips included in the white LED package shown in FIG. 6.

As shown in FIG. 8, the chip bottom portion 322 of the above-described blue LED chips 320 can have no reflection mirror surface, have a semi-reflection mirror surface, or have a full-reflection mirror surface. The bottom portion 322 of each blue LED chip 320 having the reflection mirror surface will shield the rear light, but the lateral light A, B, A' and B' emitted by the blue LED chips 320 still can be extracted from the inclined lateral surface 341 at the edge of the transparent glue layer 340 as shown in FIG. 6. Therefore, the light extraction efficiency of the rear surface 312 of the transparent plate 300 still can be increased. Furthermore, if the chip bottom portion 322 has a semi-reflection mirror surface or a full-reflection mirror surface, the phenomenon of uneven mixed color of the extracted light can also be reduced.

Furthermore, if a common glass (e.g., soda-lime glass) is used as the transparent plate 310, the refractive index is typically 1.5-1.7. If the rear transparent glue layer 340 is formed by a material having a refractive index smaller than the glass, such as silicone having a refractive index of 1.4, the light refraction percentage can be increased by a multi-layer medium with refractive indexes reduced stepwise from layer to layer, and the light reflection percentage can be thus decreased. The light emitted by the blue LED chips 320 are scattered lights. The scattered lights first pass through the transparent plate 310 made of a glass with the refractive index of 1.51, then pass through the rear transparent glue layer 340 made of a silicone with the refractive index of 1.4, and finally to the air with the refractive index of 1. Therefore, the light extraction efficiency of the above condition will be greater than the light extraction efficiency in the condition that the scattered lights first pass through the transparent plate 310 made of a glass with the refractive index of 1.51, then pass through a rear transparent glue layer with the refractive index more than or equal to 1.51, and finally to the air. That is, using the transparent glue layer 340 with a refractive index smaller than the transparent plate 310 can increase the light extraction efficiency at the rear surface of the blue LED chips 320.

Figure 9:
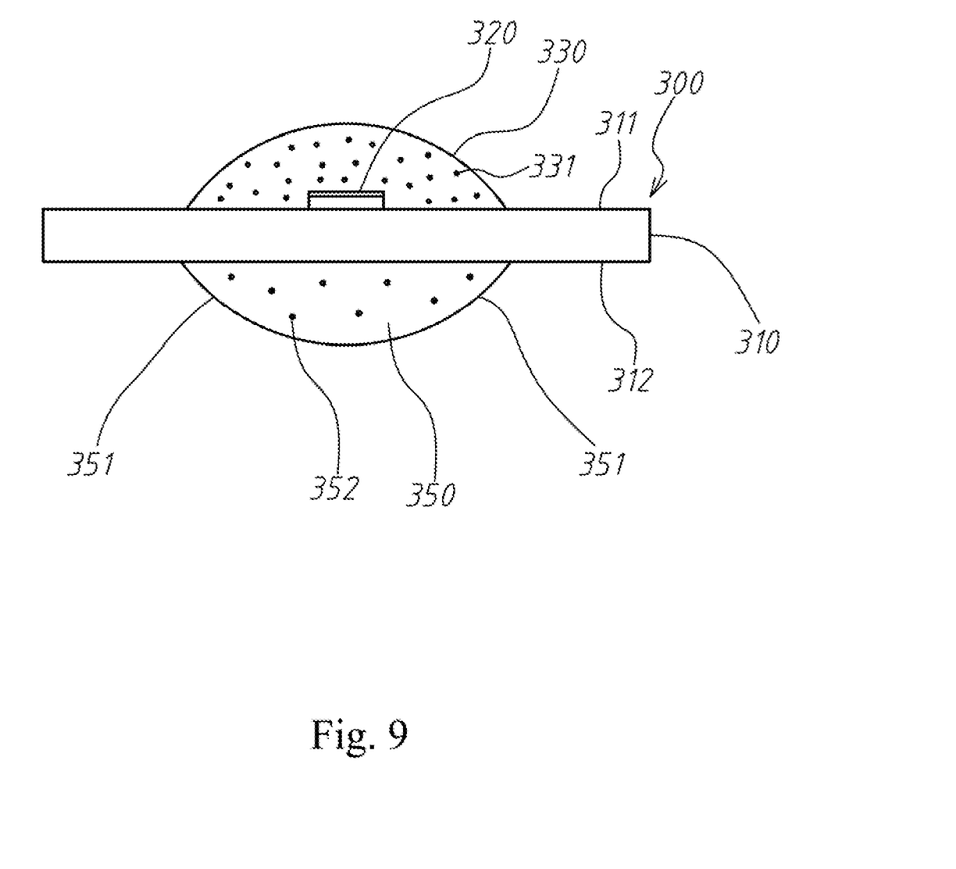
FIG. 9 is a schematic cross-sectional view of a white LED package containing plural blue LED chips according to a second embodiment of the invention.

FIG. 9 is a schematic cross-sectional view of a white LED package containing plural blue LED chips according to a second embodiment of the invention. In the foregoing first embodiment, the blue light emitted by the blue LED chips 320 and then extracted from the rear transparent glue layer 340 is mixed with the yellow fluorescent light emitted by the front fluorescent glue layer 330, then pass through the transparent plate 310 and the rear transparent glue layer 340 to form white light. However, since the intensity of the yellow lights is slightly insufficient, the white light is bluewish to make the color temperature higher. In the second embodiment, the color temperatures of the light extracted from both of the front and rear surfaces are closer.

A white LED package containing plural blue LED chips according to the second embodiment of the invention includes a transparent plate 310, plural blue LED chips 320, a front fluorescent glue layer 330, and a rear fluorescent glue layer 350. The implementation of the transparent plate 310, the plural blue LED chips 320, and the front fluorescent glue layer 330 is the same with those described in the foregoing first embodiment. That is, the transparent plate 310 has a front surface 311 and a rear surface 312 facing to each other, plural blue LED chips 320 bonded on the front surface 311 of the transparent plate 310, and a front fluorescent glue layer 330 covering the plural blue LED chips 320. In the second embodiment, the difference is that the rear transparent glue layer 340 of the first embodiment made of the silicone material is further doped with a fluorescent powder 352 to form the rear fluorescent glue layer 350. The rear fluorescent glue layer 350 also covers the rear surface 312 of the transparent plate 310 and is located at a position aligned with the front fluorescent glue layer 330. The edge of the rear fluorescent glue layer 350 also has an inclined lateral surface 351 or a curved inclined lateral surface 351.

In addition to extracting light from the front surface and the rear surface of the white LED package containing plural blue LED chips according to the second embodiment of the invention, the rear fluorescent glue layer of the white LED package can generate more yellow fluorescent light to decrease the color temperature difference between the light extracted from the front surface and the rear surface of the white LED package. Therefore, the color temperatures of the light extracted from the front surface and the rear surface of the white LED package can be closer.

What is claimed is:

1. A white light-emittin diode (LED) package containing plural blue LED chips, comprising:
   a transparent plate having a front surface and an opposite rear surface;
   plural blue LED chips bonded on the front surface of the transparent plate;
   a front fluorescent glue layer covering the plural blue LED chips; and
   a rear transparent glue layer covering the rear surface of the transparent plate and located at a position aligned with the front fluorescent glue layer for extracting light emitted from rear surfaces of the blue LED chips from the transparent plate directly, wherein the edge of the rear transparent glue layer has an inclined lateral surface, and the front fluorescent glue layer and the rear transparent glue layer are disconnected and separated by the transparent plate.

2. The white LED package of claim 1, wherein the inclined lateral surface is curved.

3. A white light-emitting diode (LED) package containing plural blue LED chips, comprising:
- a transparent plate having a front surface and an opposite rear surface;
- plural blue LED chips bonded on the front surface of the transparent plate;
- a front fluorescent glue layer covering the plural blue LED chips; and
- a rear fluorescent glue layer covering the rear surface of the transparent plate and located at a position aligned with the front fluorescent glue layer for extracting light emitted from rear surfaces of the blue LED chips from the transparent plate directly, wherein the edge of the rear fluorescent glue layer has an inclined lateral surface, and the front fluorescent glue layer and the rear fluorescent glue layer are disconnected and separated by the transparent plate.

4. The white LED package of claim 3, wherein the inclined lateral surface is curved.

* * * * *